(12) United States Patent
Hamabe

(10) Patent No.: US 11,418,272 B2
(45) Date of Patent: Aug. 16, 2022

(54) RADIO WAVE ENVIRONMENT DISPLAY DEVICE AND METHOD FOR DISPLAYING RADIO WAVE ENVIRONMENT

(71) Applicant: Panasonic Intellectual Property Management Co., Ltd., Osaka (JP)

(72) Inventor: Taichi Hamabe, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/355,546

(22) Filed: Jun. 23, 2021

(65) Prior Publication Data
US 2021/0320734 A1  Oct. 14, 2021

Related U.S. Application Data

(63) Continuation of application No. 16/717,545, filed on Dec. 17, 2019, now Pat. No. 11,075,704, which is a (Continued)

(30) Foreign Application Priority Data

Jun. 28, 2017  (JP) .............................. JP2017-125966

(51) Int. Cl.
*H04B 7/00* (2006.01)
*H04B 17/391* (2015.01)
(Continued)

(52) U.S. Cl.
CPC ....... *H04B 17/391* (2015.01); *G01R 29/0892* (2013.01); *H04B 17/318* (2015.01); *H04W 16/20* (2013.01)

(58) Field of Classification Search
CPC ............... H04B 17/391; H04B 17/318; G01R 29/0892; H04W 16/20
(Continued)

(56) References Cited

U.S. PATENT DOCUMENTS 3,787,862 A * 1/1974 Jacobson .................. G01S 3/52
　　　　　　　　　　　　　　　　　　342/418
4,219,821 A * 8/1980 Selim ...................... G01S 3/143
　　　　　　　　　　　　　　　　　　343/728
(Continued)

FOREIGN PATENT DOCUMENTS

EP　　1 732 341　　12/2006
EP　　3 136 757　　3/2017
(Continued)

OTHER PUBLICATIONS

International Search Report dated Sep. 11, 2018 in corresponding International Application No. PCT/JP2018/024284.
(Continued)

*Primary Examiner* — April G Gonzales
(74) *Attorney, Agent, or Firm* — Wenderoth, Lind & Ponack, L.L.P.

(57) ABSTRACT

A radio wave environment display device includes a display unit that displays a radio wave environment and a controller. The radio wave environment display device displays a radio wave environment in an area where a plurality of wireless transmitters located at different positions transmit radio waves. The controller selects, at each of a plurality of points in the area, a maximum intensity among intensities that are magnitudes of received power of radio waves transmitted from the wireless transmitters and causes the display unit to display the radio wave environment at each of the plurality of points based on the maximum intensity selected and an arrival direction of a radio wave with the maximum intensity selected.

9 Claims, 8 Drawing Sheets

Related U.S. Application Data continuation of application No. PCT/JP2018/024284, filed on Jun. 27, 2018.

(51) Int. Cl.
*H04B 17/318* (2015.01)
*G01R 29/08* (2006.01)
*H04W 16/20* (2009.01)

(58) Field of Classification Search
USPC .......................................................... 455/67.7
See application file for complete search history.

(56) References Cited

U.S. PATENT DOCUMENTS

| | | | | |
|---|---|---|---|---|
| 5,844,522 | A * | 12/1998 | Sheffer | H04W 64/00 340/8.1 |
| 5,977,913 | A * | 11/1999 | Christ | G01S 1/026 340/8.1 |
| 11,075,704 | B2 * | 7/2021 | Hamabe | H04B 17/3912 |
| 2005/0058075 | A1 * | 3/2005 | Gorday | H04W 4/16 370/241 |
| 2006/0163349 | A1 * | 7/2006 | Neugebauer | G06Q 20/387 235/383 |
| 2009/0239532 | A1 * | 9/2009 | Ebata | H04W 16/20 455/434 |
| 2014/0085526 | A1 * | 3/2014 | Takahashi | H01Q 3/26 348/333.02 |
| 2014/0152505 | A1 * | 6/2014 | Kim | G01S 3/40 342/443 |
| 2014/0347230 | A1 * | 11/2014 | Ohmae | G01S 3/30 343/703 |
| 2016/0050589 | A1 * | 2/2016 | Safavi | H04W 36/30 455/436 |
| 2016/0103199 | A1 * | 4/2016 | Rappaport | G01S 3/48 342/377 |
| 2016/0203347 | A1 * | 7/2016 | Bartholomew | H04B 5/0062 340/539.23 |
| 2017/0064577 | A1 * | 3/2017 | Liu | H04B 17/318 |
| 2021/0405103 | A1 * | 12/2021 | Salazar Cerreno | H04B 17/102 |

FOREIGN PATENT DOCUMENTS

| | | |
|---|---|---|
| JP | 2006-352385 | 12/2006 |
| JP | 2013-130466 | 7/2013 |
| WO | 2005/094110 | 10/2005 |

OTHER PUBLICATIONS

Tetsuro Imai, "Mobile Radio Propagation Simulation Based on Ray-Tracing Method", The transactions of the Institute of Electronics, Information and Communication Engineers B, vol. J92-B, No. 9, pp. 1333-1347, Sep. 2009.

* cited by examiner

RADIO WAVE ENVIRONMENT DISPLAY DEVICE AND METHOD FOR DISPLAYING RADIO WAVE ENVIRONMENT

BACKGROUND

1. Technical Field

The present invention relates to a radio wave environment display device and a method for displaying a radio wave environment.

2. Description of the Related Art

PTL (Patent Literature) 1 discloses a method in which an area to be estimated is divided into minute sections and reception quality from a plurality of base stations is recognized in each of the minute sections.

Here, PTL 1 is Unexamined Japanese Patent Publication No. 2006-352385.

NPL (Non-Patent Literature) 1 is Tetsuro Imai, "Mobile Radio Propagation Simulation Based on Ray-Tracing Method", The transactions of the Institute of Electronics, Information and Communication Engineers B, Vol. J92-B, No. 9, pp. 1333-1347, September 2009.

SUMMARY

The present disclosure provides a radio wave environment display device and a method for displaying a radio wave environment that appropriately displays a radio wave environment even if a plurality of wireless transmitters transmit different radio waves.

A radio wave environment display device according to one aspect of the present disclosure includes a display unit that displays a radio wave environment and a controller. The radio wave environment display device displays a radio wave environment in an area where a plurality of wireless transmitters located at different positions transmit radio waves. The controller selects, at each of a plurality of points in the area, a maximum intensity among intensities that are magnitudes of received power of radio waves transmitted from the wireless transmitters and causes the display unit to display the radio wave environment at each of the plurality of points based on the maximum intensity selected and an arrival direction of a radio wave with the maximum intensity selected.

A method for displaying a radio wave environment that is performed by the radio wave environment display device includes selecting, at each of a plurality of points in the area, a maximum intensity among intensities that are magnitudes of received power of radio waves transmitted from a plurality of wireless transmitters and displaying the radio wave environment at each of the plurality of points based on the maximum intensity selected and an arrival direction of a radio wave with the maximum intensity selected.

The radio wave environment display device and the method for displaying a radio wave environment according to the present disclosure enable the radio wave environment to be appropriately displayed even if a plurality of wireless transmitters transmit different radio waves.

DETAILED DESCRIPTION

Exemplary embodiments will be described in detail below with reference to the drawings as appropriate. However, in some cases, an unnecessarily detailed description may be omitted. For example, a detailed description of a well-known matter and a duplicated description of substantially the same configuration will be omitted in some cases. This is to avoid unnecessary redundancy in the following description and to facilitate understanding by those skilled in the art.

It is noted that the accompanying drawings and the description below are provided to enable those skilled in the art to fully understand the present disclosure, and are not intended to limit the subject matters described in the claims.

First Exemplary Embodiment

Figure 1:
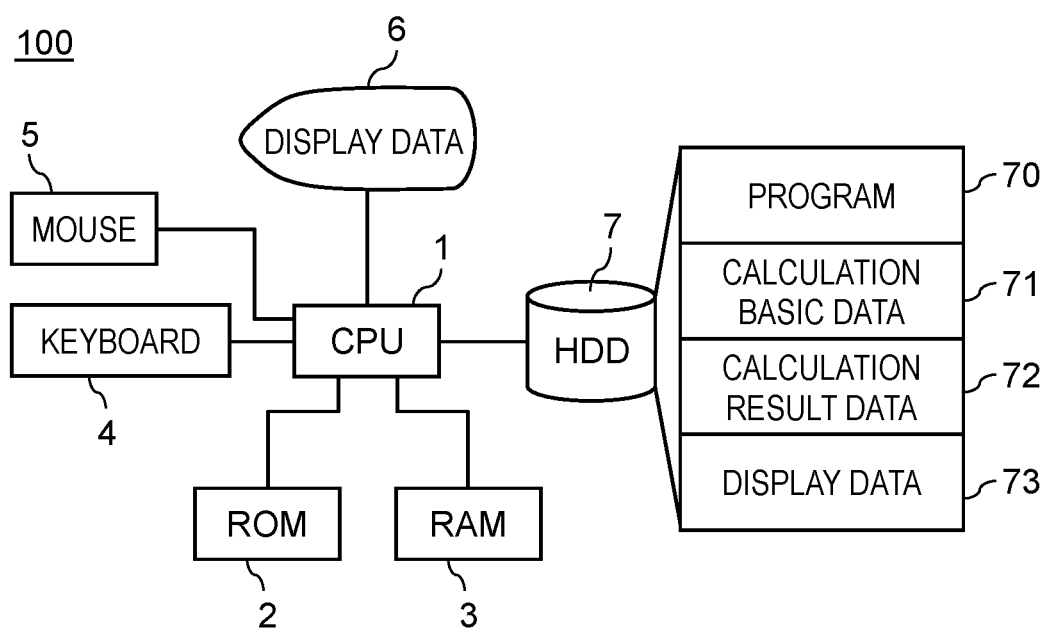
FIG. 1 is a block diagram illustrating an example of a hardware configuration of radio wave environment display device 100 according to an exemplary embodiment.

FIG. 1 is a block diagram illustrating an example of a hardware configuration of radio wave environment display device 100 according to an exemplary embodiment.

Figure 6:
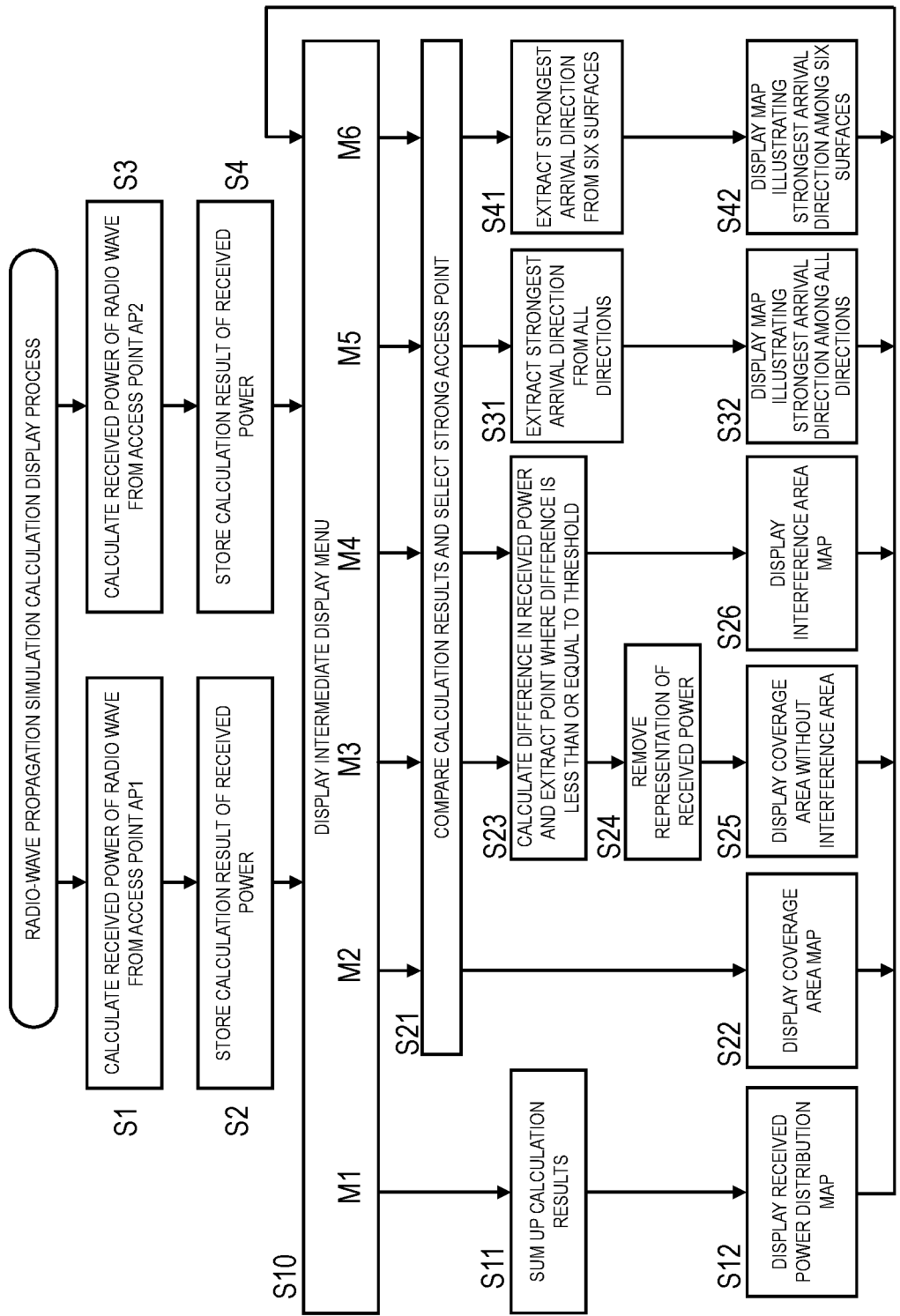
FIG. 6 is a flowchart of a radio-wave propagation simulation calculation display process performed by radio wave environment display device 100 illustrated in FIG. 1.
Figure 7:
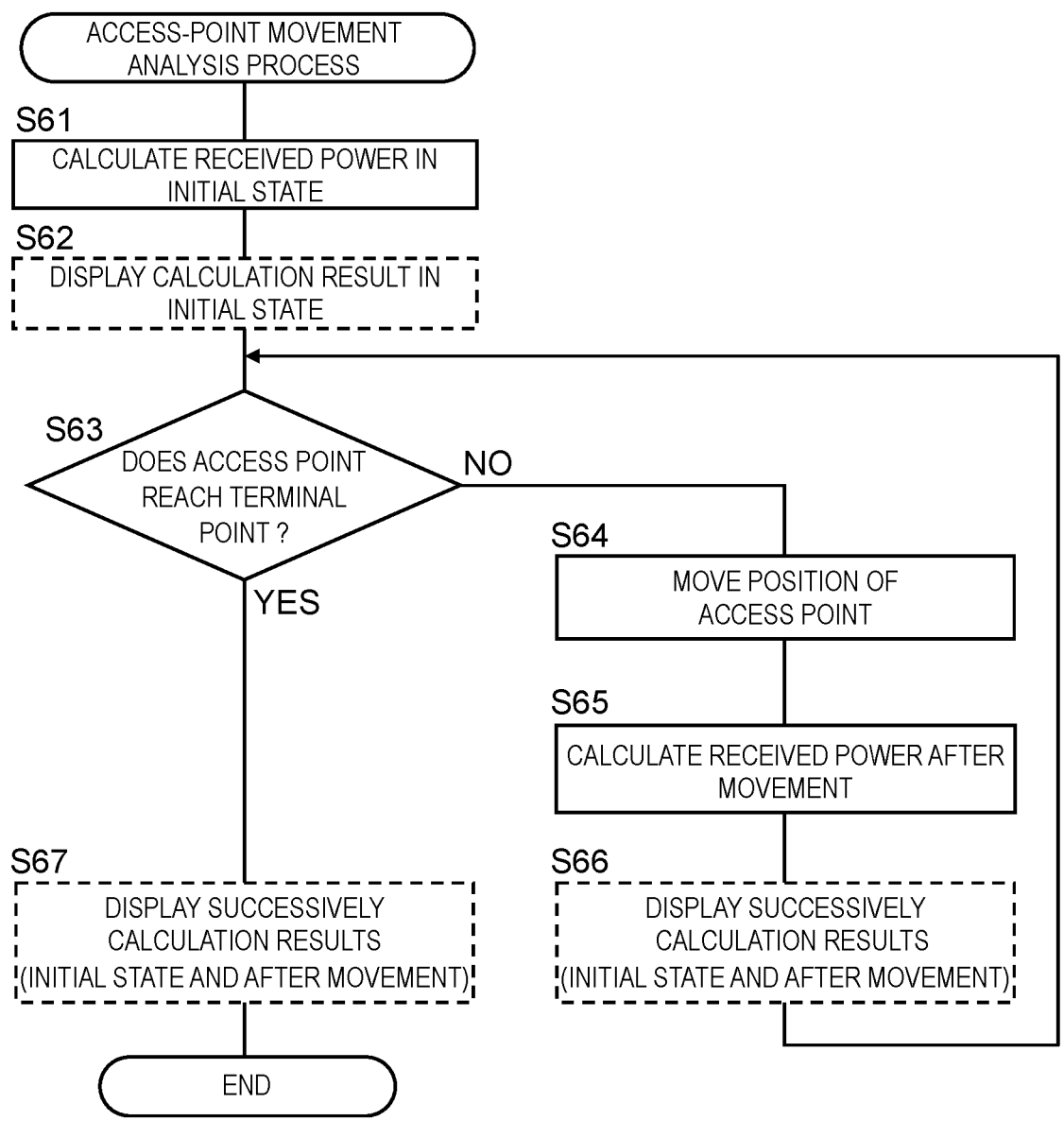
FIG. 7 is a flowchart of an access-point movement analysis process performed by radio wave environment display device 100 illustrated in FIG. 1.
Figure 8:
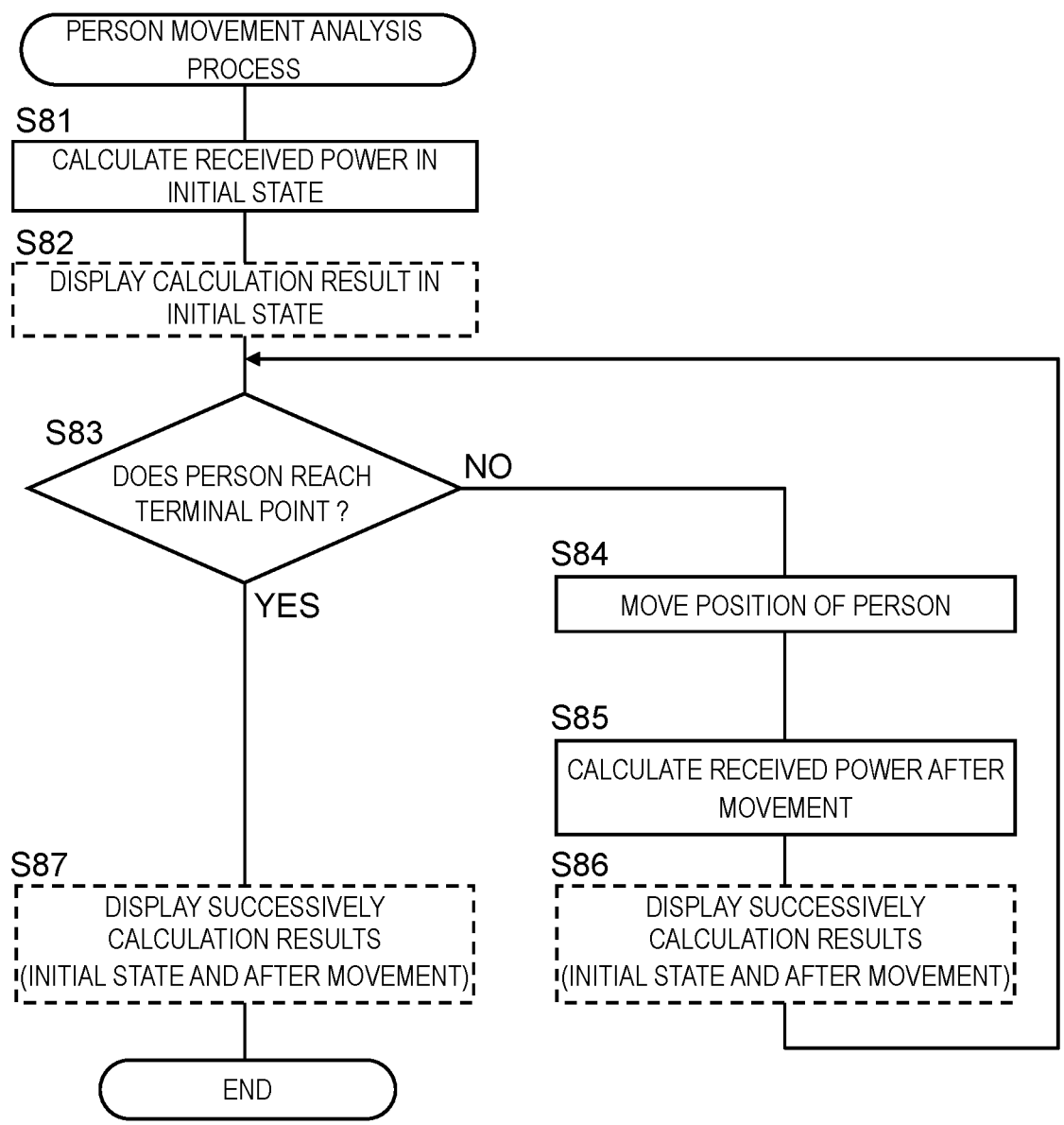
FIG. 8 is a flowchart of a person movement analysis process performed by radio wave environment display device 100 illustrated in FIG. 1.

In FIG. 1, radio wave environment display device 100 performs a radio-wave propagation simulation calculation display process illustrated in FIG. 6, an access-point movement analysis process illustrated in FIG. 7, and a person movement analysis process illustrated in FIG. 8 to simulate a radio wave environment based on calculation basic data 71 of an area model and display a received power distribution map and the like. Radio wave environment display device 100 includes central processing unit (CPU) 1, and read only memory (ROM) 2, random access memory (RAM) 3, keyboard 4, mouse 5, display 6, and hard disk drive (HDD) 7 that are connected to CPU 1.

CPU 1 configures a controller that controls an entire device. An operating system (OS) program is stored in ROM 2. The OS program is executed when radio wave environment display device 100 starts up. RAM 3 is used as a work region when the radio-wave propagation simulation calculation display process illustrated in FIG. 6, the access-point movement analysis process illustrated in FIG. 7, and the person movement analysis process illustrated in FIG. 8 are performed. Keyboard 4 and mouse 5, which are operating units, function as a human interface and are used for various settings in the various processes described above. Display 6 not only functions as a human interface but also displays contents of the various settings, an operating state of the device, and display data 73 of various calculation results and analysis results. Display 6 is an example of display unit.

HDD 7 stores programs 70 for the radio-wave propagation simulation calculation display process illustrated in FIG. 6, the access-point movement analysis process illustrated in FIG. 7, and the person movement analysis process illustrated in FIG. 8, calculation basic data 71 required for calculations in the radio-wave propagation simulation calculation display process, calculation result data 72, and display data 73 that is created based on calculation result data 72. Calculation basic data 71 includes information about a map of an area, an object located in the area, a material for the object in the area, a position of a transmitter, and the like.

The program for the radio-wave propagation simulation calculation display process is read from HDD 7 into RAM 3 and then executed. Alternatively, the program may be configured to be recorded in a recording medium other than HDD 7 (for example, compact disk read only memory (CD-ROM)) and read from the recording medium into RAM 3 by a compatible reading device (CD-ROM drive device).

Figure 3:
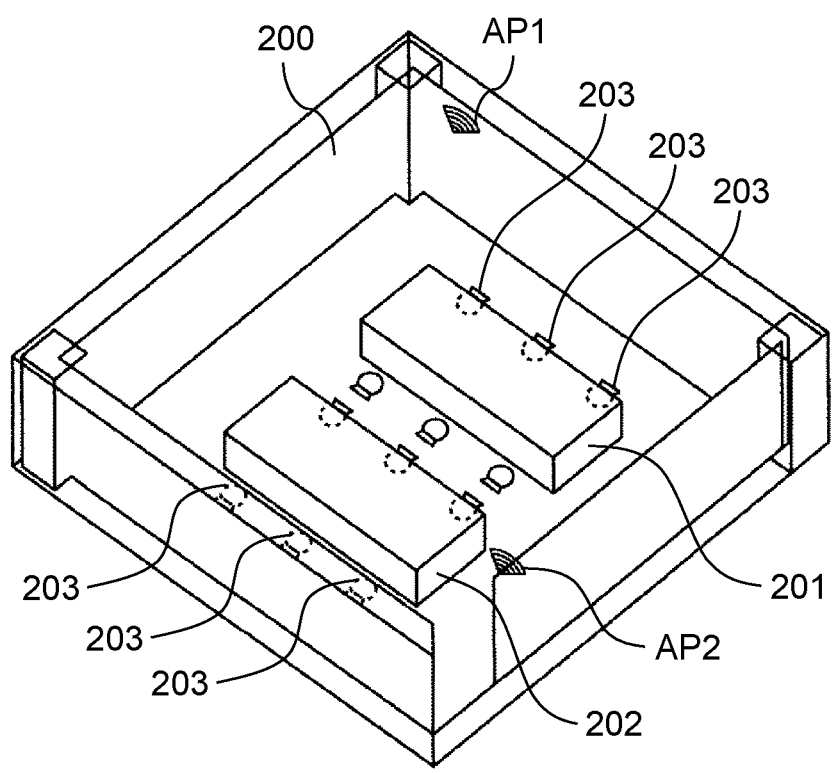
FIG. 3 is a perspective view illustrating a configuration example of a model area subjected to a simulation by radio wave environment display device 100 illustrated in FIG. 1.
Figure 4:
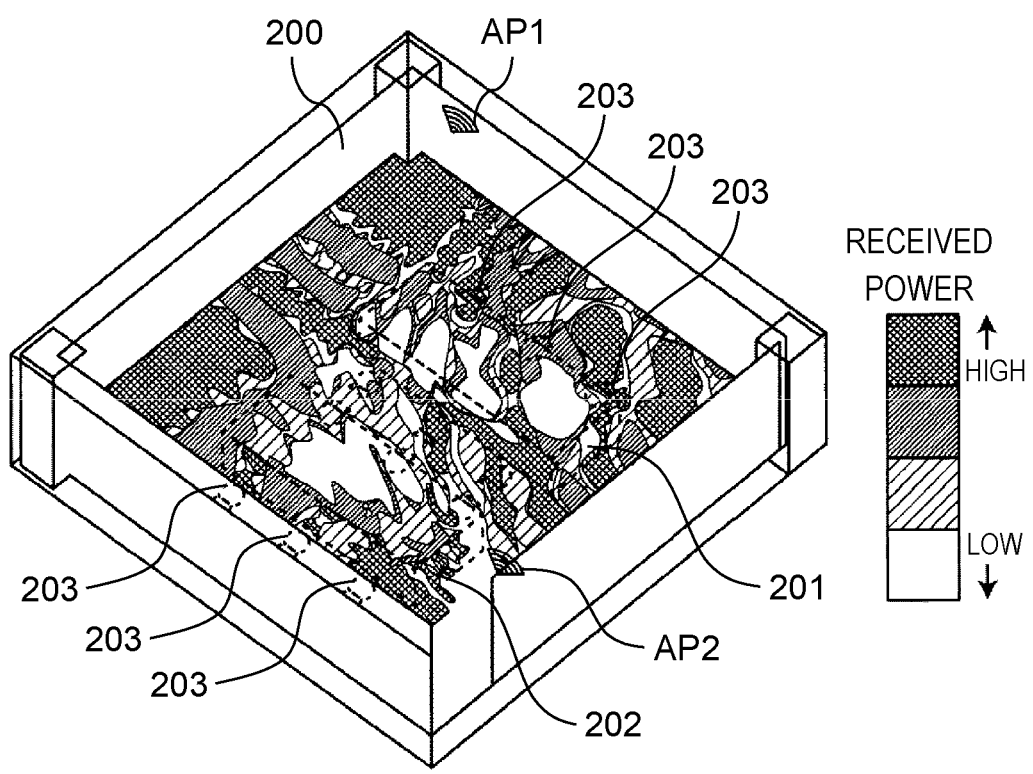
FIG. 4 is a perspective view illustrating a display example of a received power distribution in the model area subjected to a simulation by radio wave environment display device 100 illustrated in FIG. 1.
Figure 5:
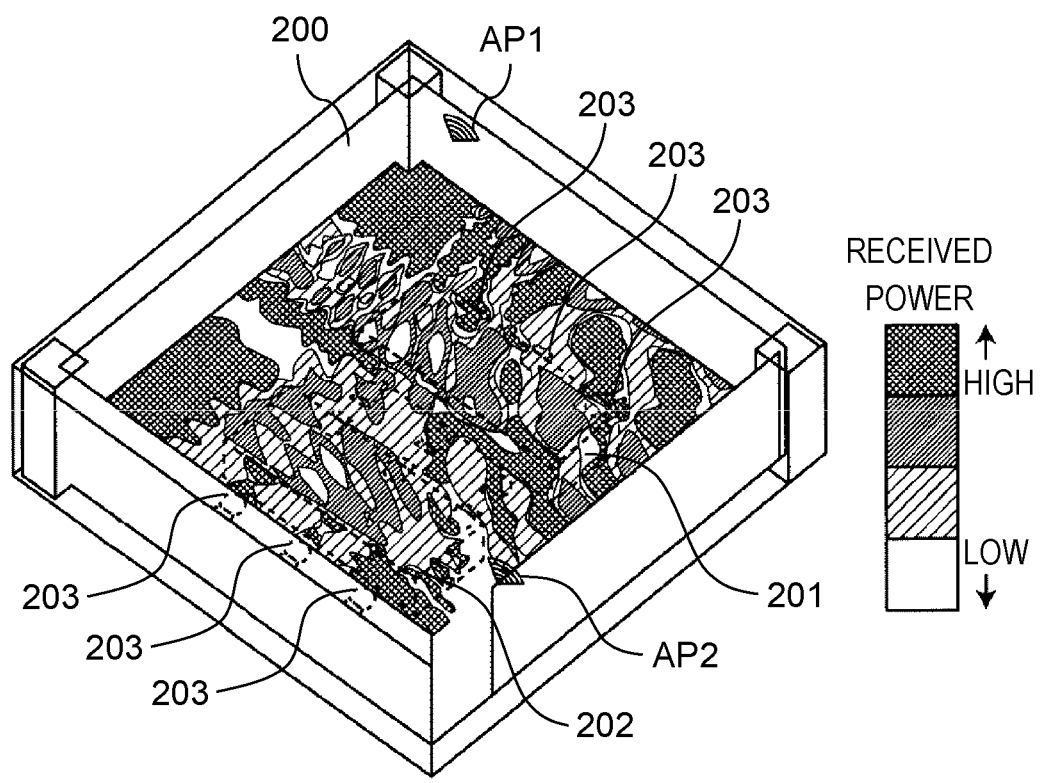
FIG. 5 is a perspective view illustrating a display example of a coverage area in the model area subjected to a simulation by radio wave environment display device 100 illustrated in FIG. 1.

FIG. 3 is a perspective view illustrating a configuration example of a model area subjected to a simulation by radio wave environment display device 100 illustrated in FIG. 1. In the configuration example of the model area illustrated in FIG. 3, two desks 201, 202 and twelve chairs 203 that are radio wave obstacles are arranged in room 200 that is shaped in a rectangle and has a flat bottom surface. Calculation basic data used in the radio-wave propagation simulation calculation display process includes the following:

(1) Data about transmission power (dBm), frequencies, a modulation method, and a gain and height of antennas in wireless transmitters at access points AP1, AP2, and the like (2) Data about a gain and height of an antenna in a wireless receiver assumed and the like (3) Data about a three-dimensional size of room 200 that is the model area (4) Data about a three-dimensional size and position (two-dimensional coordinates in room 200) of a radio wave obstacle FIG. 4 is a perspective view illustrating a display example of a received power distribution (S12 in FIG. 6) in a model area subjected to a simulation by radio wave environment display device 100 illustrated in FIG. 1. FIG. 5 is a perspective view illustrating a display example of a coverage area (S22 in FIG. 6) in the model area subjected to a simulation by radio wave environment display device 100 illustrated in FIG. 1. In FIGS. 4 and 5, the received power of radio waves and the like are represented as a density of black and white hatching because of restrictions on online applications. However, the received power is actually represented in colors, for example.

In displaying a radio wave environment in the conventional technique disclosed in, for example, PTL 1, received power from two or more wireless transmitters is summed up and resultant received power is then displayed. When different radio waves are transmitted from the wireless transmitters, radio wave interference occurs in practice. It is thus technically meaningless to practically display the summed received power. On the other hand, in displaying a radio wave environment as illustrated in FIG. 5, as will be described later in detail, received power of, for example, two radio waves is compared and higher received power is displayed, which is very practical. Other characteristics of the exemplary embodiment will be described later in detail.

FIG. 6 is a flowchart of a radio-wave propagation simulation calculation display process performed by radio wave environment display device 100 illustrated in FIG. 1. In the present exemplary embodiment, received power of each of points (a plurality of points obtained by dividing model area into 100×100, for example) in a model area can be calculated based on calculation basic data 71 described above by a well-known ray-tracing method (see NPL 1, for example) or a well-known statistical estimation method.

At step S1 in FIG. 6, received power of a radio wave from a wireless transmitter located at access point AP1 and an arrival direction are calculated at each point based on calculation basic data 71. At step S2, a calculation result of the received power and the arrival direction are stored in HDD 7 as calculation result data 72, and the process proceeds to step S10. At step S3, received power of a radio wave from a wireless transmitter located at access point AP2 and an arrival direction are calculated at each point based on calculation basic data 71. At step S4, a calculation result of the received power and the arrival direction are stored in HDD 7 as calculation result data 72, and the process proceeds to step S10.

At step S10, a selection display screen for allowing a user to select a display of an operation among the following operations is displayed. As the user inputs one of menu numbers M1 to M6 through keyboard 4, the process branches to step S11 or step S21. When the process proceeds to step S21, a menu number selected is stored and the process finally proceeds to one of steps S22, S25, S26, S32, and S42 corresponding to the menu number selected.

(M1) Received power of radio waves from the wireless transmitters at two access points AP1, AP2 is summed up and a received power distribution map is then displayed.

(M2) Received power (maximum intensity) of a stronger radio wave of radio waves from the wireless transmitters at two access points AP1, AP2 is selected, the received power of the stronger radio wave selected is made to correspond to each point in an area, and a coverage area map is displayed.

(M3) Received power of a stronger radio wave of radio waves from the wireless transmitters at two access points AP1, AP2 is selected. In addition, a difference between the received power of two radio waves is calculated, a representation of the received power is removed at a point with relatively large interference where the difference is less than or equal to a predetermined threshold, and a coverage area map without an interference area is displayed.

(M4) Received power of a stronger radio wave of radio waves from the wireless transmitters at two access points AP1, AP2 is selected. In addition, a difference between the received power of two radio waves is calculated, and a point with relatively large interference where the difference is less than or equal to a predetermined threshold is displayed as an interference area map.

(M5) Received power of a stronger radio wave of radio waves from the wireless transmitters at two access points AP1, AP2 is selected. An arrival direction map that illustrates, at each point, a strongest arrival direction among all arrival directions of the received power of the stronger radio wave selected is displayed.

(M6) Received power of a stronger radio wave of radio waves from the wireless transmitters at two access points AP1, AP2 is selected. An arrival direction map is then is displayed. The arrival direction map illustrates, at each point, a strongest arrival surface direction among six surfaces of the received power of the stronger radio wave selected, that is, front, back, left, right, up, and down of the stronger radio wave selected.

When menu number M1 is selected at step S10, at step S11, received power of radio waves from the wireless transmitters at two access points AP1, AP2 is summed up (S11), the received power distribution map is displayed (S12), and the process returns to step S10.

When menu number M2 is selected at step S10, at step S21, received power of a stronger radio wave of radio waves from the wireless transmitters at two access points AP1, AP2 is selected, the coverage area map is displayed (S22), and the process returns to step S10. It is more practical to display the coverage area map as compared to a case where the received power distribution map that illustrates the received power summed up is displayed. This is because interference occurs in actuality and thus the received power is not equal to the received power summed up in some cases.

When menu number M3 is selected at step S10, at step S21, received power of a stronger radio wave of radio waves from the wireless transmitters at two access points AP1, AP2 is selected, and the same time the difference between the received power of two radio waves is calculated, and a point with relatively large interference where the difference is less than or equal to a predetermined threshold is extracted (S23). Next, a representation of the received power at the point extracted at step S23 is removed (S24), the coverage area map without an interference area is displayed (S25), and the process proceeds to step S10. As the coverage area map without the interference area is displayed, interference of two radio waves can be reproduced, which is more practical as compared to a case of simply displaying higher received power.

When menu number M4 is selected at step S10, at step S21, received power of a stronger radio wave of radio waves from the wireless transmitters at two access points AP1, AP2 is selected, the difference between the received power of two radio waves is calculated, a point with relatively large interference where the difference is less than or equal to the predetermined threshold is extracted (S23), an interference area map is displayed (S26), and the process returns to step S10. As the interference area map is displayed as described above, interference of two radio waves can be reproduced and an interference area can be simply displayed.

When menu number M5 is selected at step S10, at step S21, received power of a stronger radio wave of radio waves from the wireless transmitters at two access points AP1, AP2 is selected, and at each point, the strongest arrival direction is extracted from all directions (S31), the arrival direction map is displayed (S32), and the process returns to step S10.

When menu number M6 is selected at step S10, at step S21, received power of a stronger radio wave of radio waves from the wireless transmitters at two access points AP1, AP2 is selected, and at each point, the strongest arrival surface direction is extracted from six surfaces, that is, front, back, left, right, up, and down (S41), the arrival direction map is displayed (S42), and the process returns to step S10.

With the radio-wave propagation simulation calculation display process described above with reference to FIG. 6, a simulation calculation is performed on six types of displays at steps S21, S22, S25, S26, S32, and S42 of FIG. 6 and these displays are displayed.

Next, an exemplary embodiment will be described hereinafter with reference to processes illustrated in FIGS. 7 and 8 performed by radio wave environment display device 100 illustrated in FIG. 1. The exemplary embodiment describes representations of the following matters:

(1) How to move an access point in order to improve a radio wave environment
(2) Where to install a new access point in order to improve the radio wave environment
(3) Changes in the radio wave environment when an object such as a person, which is an obstacle, moves FIG. 7 is a flowchart of an access-point movement analysis process performed by radio wave environment display device 100 illustrated in FIG. 1. Referring to FIG. 7, an analysis result obtained when a wireless transmitter at an access point is moved is displayed.

A user inputs first a movement range of an access point from a predetermined position to a destination point. The destination point input is defined as a terminal point.

Received power in an initial state is calculated at step S61 of FIG. 7, a result of the calculation is displayed (S62), and it is determined whether the access point has reached the terminal point input by the user (S63). When the determination at step S63 is NO, the process proceeds to step S64. On the other hand, when the determination at step S63 is YES, the process proceeds to step S67. While the calculation result is displayed at step S62, the present disclosure is not limited to this case and the calculation result need not to be displayed at that step.

A wireless transmitter is moved to a position of the access point that is the terminal point at step S64, received power after movement is calculated (S65), the calculation results of the received power in the initial state and after movement are successively displayed (S66), and the process returns to step S63. While the calculation result is displayed at step S66, the present disclosure is not limited to this case and the calculation result need not to be displayed at that step.

The calculation results of the received power in the initial state and after movement are successively displayed at step S67 and the process ends. When the calculation result is displayed in real time at step S66, the calculation result need not to be displayed at step S67.

As described above, the entire access-point movement analysis process illustrated in FIG. 7 is performed so as to fix the wireless transmitter at access point AP1 but move the wireless transmitter at access point AP2, for example. Consequently, it is possible to visualize how to move an access point in order to improve a radio wave environment.

Alternatively, the entire access-point movement analysis process illustrated in FIG. 7 is performed so as to fix wireless transmitters at two access points AP1, AP2 but move a wireless transmitter at another access point AP3, for example. Consequently, it is possible to visualize where to install a new access point.

FIG. 8 is a flowchart of a person movement analysis process performed by radio wave environment display device 100 illustrated in FIG. 1. While a person is assumed to be a moving object in FIG. 8, various radio wave obstacles (vehicles) other than a person may be possible. A user inputs first a movement range of a person from one position to another position. Points input are defined as a start point and a terminal point, respectively.

Received power when the person is at the start point is calculated at step S81 of FIG. 8, a result of the calculation is displayed (S82), and it is determined whether the person has reached the terminal point (S83). When the determination at step S83 is NO, the process proceeds to step S84. On the other hand, when the determination at step S83 is YES, the process proceeds to step S87. While the calculation result is displayed at step S82, the present disclosure is not limited to this case and the calculation result need not to be displayed at that step.

A position of the person is moved at step S84, received power after movement is calculated (S85), the calculation results of the received power in the initial state and after movement are successively displayed (S86), and the process returns to step S83. While the calculation result is displayed at step S86, the present disclosure is not limited to this case and the calculation result need not to be displayed at that step.

The calculation results of the received power in the initial state and after movement are successively displayed at step S87 and the process ends. When the calculation result is displayed in real time at step S86, the calculation result need not to be displayed at step S87.

As described above, it is possible to visualize a change in a radio wave environment in a received power distribution obtained when a person moves within an area, for example.

Modification

Figure 2:
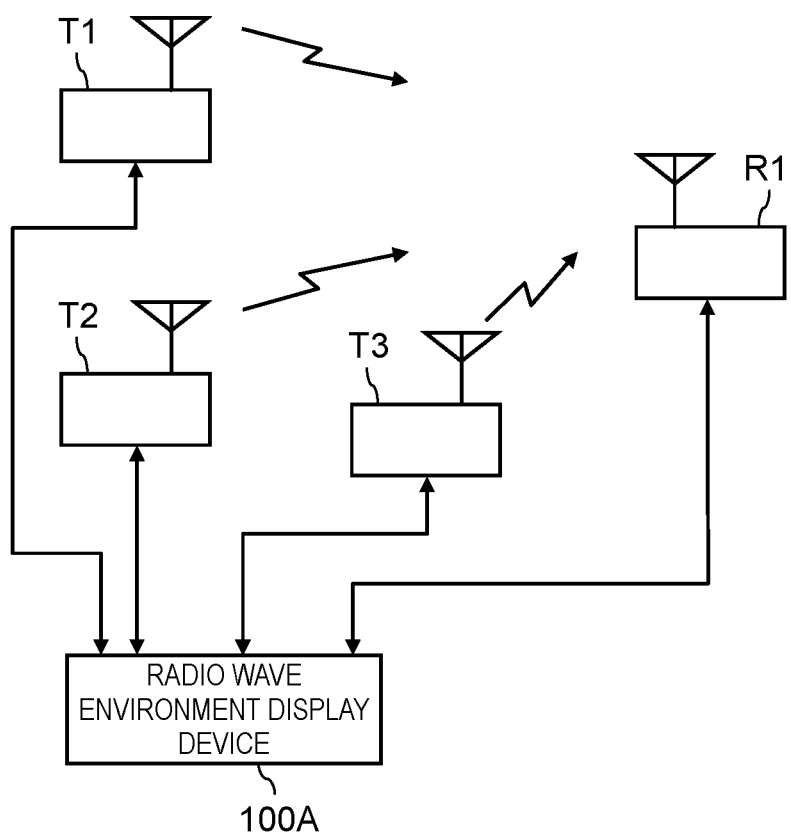
FIG. 2 is a block diagram illustrating an example of a hardware configuration of radio wave environment display device 100A and peripheral devices according to a modification.

FIG. 2 is a block diagram illustrating an example of a hardware configuration of radio wave environment display device 100A and peripheral devices according to a modification. In the exemplary embodiment, a received power distribution and the like are calculated in a simulation based on radio waves from wireless transmitters at access points AP1, AP2 at steps S1 to S4 of the radio-wave propagation simulation calculation display process illustrated in FIG. 6. The modification of FIG. 2 includes three wireless transmitters T1 to T3, wireless receiver R1, and radio wave environment display device 100A that controls these wireless transmitters and wireless receiver. An actual experiment may be performed to receive radio waves from wireless transmitters T1 to T3 by wireless receiver R1 and perform the processes at steps S10 to S42 illustrated in FIG. 6. The access-point movement analysis process illustrated in FIG. 7 and the person movement analysis process illustrated in FIG. 8 may also be performed in a similar manner.

While three wireless transmitters T1 to T3 are used in the modification of FIG. 2, the present disclosure is not limited to this case. At least two and four or more wireless transmitters may be installed at different positions and transmit different radio waves. That is to say, in a radio wave environment display device that displays a radio wave environment in an area where a plurality of wireless transmitters located at different positions transmit different radio waves, at a point in the area, a highest intensity (maximum intensity) may be selected among a plurality of intensities that are magnitudes of received power of radio waves from the wireless transmitters and displayed.

Other Modifications

In the exemplary embodiment and the modification described above, a received power distribution in an area may be calculated and displayed when transmission of a radio wave from each of wireless transmitters at two access points is ON or OFF.

Meshes that divide the area into points need not to have the same size and are uniform. That is to say, the meshes that divide the area into points may be set to have different sizes. For example, the size of a mesh may be set to be larger than a predetermined value near a wireless transmitter at an access point because the intensity of radio waves is sufficiently high. On the other hand, the size of the mesh may be set to be smaller than the predetermined value at a point far away from the wireless transmitter at the access point because the intensity of radio waves at this point is lower than the intensity of radio waves near the wireless transmitter at the access point.

While received power is calculated for each mesh that divides the area into points, the present disclosure is not limited to this case. For example, the received power for a plurality of meshes may be collectively calculated and displayed, for example, an average of the received power may be calculated and displayed.

While the received power distribution is displayed in color, for example, a change in received power over time may be displayed in a bar graph. In mobile communication system, reflected waves has to be considered because of a multi-pass environment. Consequently, "delay spread" as well as the received power distribution may be calculated and displayed.

The received power may be displayed in real time during a calculation of the received power. In particular, it is advantageous when the received power is measured on the site, since a change in level is recognized in real time when a surrounding object moves. In addition, an arrival direction can be displayed in real time by extracting a surface and polarization of the maximum power. When a plurality of wireless receivers are installed and received power is calculated for display, a flow of radio waves at each point is visualized.

While the received power (dBm) is calculated in the exemplary embodiment and modifications described above, the present disclosure is not limited to this case, and a received field intensity (V/m) of a radio wave may be displayed.

In the exemplary embodiment and modifications described above, a radio wave environment display device that displays a radio wave environment in an area where a plurality of wireless transmitters located at different positions transmit different radio waves selects, at a point in the area, a maximum intensity among intensities that are magnitudes of received power of radio waves transmitted from the wireless transmitters and causes a display unit to display the radio wave environment based on the highest intensity selected. In this case, the maximum intensity corresponds to the point in the area and is displayed as the radio wave environment.

The maximum intensity may be displayed while a point where a difference between two highest intensities among intensities that are magnitudes of received power of radio waves transmitted from a plurality of wireless transmitters is less than or equal to a first threshold is removed from points in the area.

Alternatively, the maximum intensity may be displayed at a point where a difference between two highest intensities among intensities that are magnitudes of received power of radio waves transmitted from the wireless transmitters is more than or equal to a second threshold, among the points in the area.

Among the points in the area, a point where a difference between two highest intensities among intensities that are magnitudes of received power of radio waves transmitted from the wireless transmitters is less than or equal to a third threshold may be selected and displayed.

For the points in the area, an arrival direction of a radio wave with the highest intensity among intensities that are magnitudes of received power of radio waves transmitted from the wireless transmitters is displayed. The arrival direction of the radio wave with the maximum received power is selected from six directions corresponding to predetermined six surfaces surrounding each point and displayed.

Radio wave environments before and after a change in a position of at least one of the wireless transmitters are successively displayed.

Moreover, radio wave environments before and after movement of an object in the area are successively displayed. Alternatively, a radio wave environment at a time when an additional wireless transmitter is installed at a position different from the positions of the wireless transmitters and radio wave environments before and after the additional wireless transmitter is installed are successively displayed.

INDUSTRIAL APPLICABILITY

The present disclosure is capable of appropriately displaying a radio wave environment even if a plurality of wireless transmitters transmit different radio waves and is, in particular, industrially useful for recognizing the radio wave environment.

What is claimed is:

1. A device for causing a display to display a radio wave environment in an area where a plurality of wireless transmitters that are located at different positions transmit radio waves, the device comprising:
   a memory configured to store:
      received power of the radio waves at a point in the area, and
      arrival directions of the radio waves at the point in the area; and
   a controller configured to:
      cause the display to display a screen for allowing a user to select an item among a plurality of items, and
      cause the display to display a radio wave environment, based on the item selected by the user and at least one of (i) the received power and (ii) the arrival directions of the radio waves, wherein
   the plurality of wireless transmitters includes a first wireless transmitter and a second wireless transmitter, and
   the controller is configured to:
      extract an interference map based on a difference between first received power of a radio wave transmitted from the first wireless transmitter and second received power of a radio wave transmitted from the second wireless transmitter, and
      cause the display to display, as the radio wave environment, an area map based on the extracted interference map.

2. The device according to claim 1, wherein the radio wave environment is displayed on a map that illustrates the area.

3. The device according to claim 1, wherein the controller is configured to cause the display to display, as the radio wave environment, a power distribution map that indicates a sum of the received power of the radio waves.

4. The device according to claim 1, wherein the controller is configured to cause the display to display, as the ratio wave environment, a coverage area map that indicates maximum received power among the received power of the radio waves.

5. The device according to claim 1, wherein the controller is configured to cause the display to display, as the radio wave environment, an arrival direction map that indicates an arrival direction among the arrival directions of the radio waves, the arrival direction corresponding to maximum received power among the received power of the radio waves.

6. The device according to claim 1, wherein the controller is configured to:
   calculate the received power and the arrival directions, and
   cause the memory to store the calculated received power and the calculated arrival directions.

7. The device according to claim 1, wherein the received power and the arrival directions are calculated in a simulation.

8. The device according to claim 1, wherein the received power and the arrival directions are received by a wireless receiver that is located at the point in the area and receives the radio waves transmitted from the plurality of wireless transmitters.

9. A method of causing a display to display a radio wave environment in an area where a plurality of wireless transmitters that are located at different positions transmit radio waves, the method comprising:
   storing received power of the radio waves at a point in the area and arrival directions of the radio waves at the point in the area;
   causing the display to display a screen for allowing a user to select an item among a plurality of items; and
   causing the display to display a radio wave environment, based on the item selected by the user and at least one of (i) the received power and (ii) the arrival directions of the radio waves, wherein
   the plurality of wireless transmitters includes a first wireless transmitter and a second wireless transmitter, and
   the method further comprises:
   extracting an interference map based on a difference between first received power of a radio wave transmitted from the first wireless transmitter and second received power of a radio wave transmitted from the second wireless transmitter; and
   causing the display to display, as the radio wave environment, an area map based on the extracted interference map.

* * * * *